United States Patent
Chiu et al.

(10) Patent No.: US 9,519,583 B1
(45) Date of Patent: Dec. 13, 2016

(54) DEDICATED MEMORY STRUCTURE HOLDING DATA FOR DETECTING AVAILABLE WORKER THREAD(S) AND INFORMING AVAILABLE WORKER THREAD(S) OF TASK(S) TO EXECUTE

(71) Applicant: INTERNATIONAL BUSINESS MACHINES CORPORATION, Armonk, NY (US)

(72) Inventors: George L. Chiu, Cross River, NY (US); Alexandre E. Eichenberger, Chappaqua, NY (US); John K. P. O'Brien, South Salem, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/963,918

(22) Filed: Dec. 9, 2015

(51) Int. Cl.
| | | |
|---|---|---|
| G06F 12/00 | (2006.01) | |
| G06F 13/00 | (2006.01) | |
| G06F 13/28 | (2006.01) | |
| G11C 7/10 | (2006.01) | |
| G06F 9/38 | (2006.01) | |
| G06F 12/08 | (2016.01) | |
| G06F 9/52 | (2006.01) | |
| G06F 9/50 | (2006.01) | |

(52) U.S. Cl.
CPC ......... G06F 12/0811 (2013.01); G11C 7/1072 (2013.01); *G06F 9/3838* (2013.01); *G06F 9/3851* (2013.01); *G06F 9/3861* (2013.01); *G06F 9/5016* (2013.01); *G06F 9/52* (2013.01); *G06F 2212/283* (2013.01)

(58) Field of Classification Search
None
See application file for complete search history.

(56) References Cited

U.S. PATENT DOCUMENTS

| | | | |
|---|---|---|---|
| 6,167,423 A | 12/2000 | Chopra et al. | |
| 7,380,039 B2 | 5/2008 | Miloushev et al. | |
| 7,548,989 B2 | 6/2009 | Alexander, III et al. | |
| 7,689,989 B2 | 3/2010 | Dostert et al. | |
| 7,844,971 B2 | 11/2010 | Ma et al. | |
| 7,873,532 B2 | 1/2011 | Jones et al. | |
| 8,079,035 B2 | 12/2011 | Hankins et al. | |
| 8,881,159 B2 | 11/2014 | Eichenberger et al. | |
| 2003/0120896 A1* | 6/2003 | Gosior | G06F 9/3851 712/32 |
| 2007/0150895 A1* | 6/2007 | Kurland | G06F 9/3009 718/102 |
| 2008/0235688 A1 | 9/2008 | Panttaja et al. | |

(Continued)

OTHER PUBLICATIONS

Kornafeld, A. "PyMW—a Python Module for Parallel Master Worker Computing", First International Conference on Parallel, Distributed and Grid Computing for Engineering 2009 (PARENG 2009), (Apr. 6-8, 2009), Pecs, Hungary, 15 pages.

(Continued)

*Primary Examiner* — Jared Rutz
*Assistant Examiner* — Marwan Ayash
(74) *Attorney, Agent, or Firm* — Scully, Scott, Murphy & Presser, P.C.; Daniel P. Morris, Esq.

(57) ABSTRACT

The present disclosure relates generally to a dedicated memory structure (that is, hardware device) holding data for detecting available worker thread(s) and informing available worker thread(s) of task(s) to execute.

14 Claims, 5 Drawing Sheets

(56) References Cited

U.S. PATENT DOCUMENTS

| | | | |
|---|---|---|---|
| 2008/0307422 A1* | 12/2008 | Kurland | G06F 15/7842 |
| | | | 718/102 |
| 2010/0037222 A1 | 2/2010 | Tatsubori et al. | |
| 2011/0161976 A1 | 6/2011 | Alexander et al. | |
| 2012/0011144 A1* | 1/2012 | Transier | G06F 17/3033 |
| | | | 707/769 |

OTHER PUBLICATIONS

"A High Performance Message Passing Library", Open MPI: Open Source High Performance computing, printed: Nov. 2, 2015, htttp://www/open-mpi.org/, 2 pages.

Barney, B. et al., "Message Passing Interface (MPI)", printed: Nov. 2, 2015, https://computing.llnl.gov/tutorial/mpi/#AppendixA, pp. 1-41.

"CPU cache", printed: Nov. 2, 2015, https://en.wikipedia.org/wiki/CPU_cache, pp. 1-24.

* cited by examiner

DEDICATED MEMORY STRUCTURE HOLDING DATA FOR DETECTING AVAILABLE WORKER THREAD(S) AND INFORMING AVAILABLE WORKER THREAD(S) OF TASK(S) TO EXECUTE

This invention was made with Government support under Contract No.: B554331 awarded by Department of Energy. The Government has certain rights in this invention.

BACKGROUND

The present disclosure relates generally to a dedicated memory structure (that is, hardware device) holding data for detecting available worker thread(s) and informing available worker thread(s) of task(s) to execute.

When creating a parallel region in code, critical data is passed from a master thread to one or more worker threads. When such data is kept in memory, such as a main memory, this forces the master thread to write the data to the main memory. Then, the one or more worker threads read the data from the main memory. Given the fact that there are typically many items that must be written and read, these operations often result in very long latencies that are on the critical path (since the worker thread(s) must first be told of where to find their work prior to them starting to do the work).

In a system with data caches, this latency can be shortened somewhat if the data is cached. However, since the data is written by one thread (such as the master thread) and read by one or more worker threads, communication misses will typically occur when the master thread and the worker thread(s) do not share the same caches in the hierarchy. For example, if two threads do not share an L1 cache but share an L2 cache, then the communication cost will be represented by one or more L1 misses, depending on the size of the data structure being communicated. If among all worker threads, one or more do not share an L1 cache or L2 cache, then the critical path cost will be dominated by the thread having the longest latency, i.e. the one missing in the L3 in this example.

A further problem with caches is that the data being communicated in cache may not even initially reside in the cache. Since most modern caches read on cache line allocation, then the sequence will start by reading the entire cache line from main memory to the caches prior to issue of the first write into that data structure. Depending on the size of the cache line, this reading of the line may become a substantial cost, possibly even the dominant cost of the entire communication from the master thread to the worker thread.

A similar cost occurs with storing the bitvectors that represent which thread(s) are busy and which thread(s) are free to work in a given parallel region in code. These bits are read and written by a master thread attempting to acquire other thread(s) as worker thread(s). When these bitvectors are in main memory or caches, they result in long latencies when accessed.

One reason why it is important to reduce such overhead and critical path is that the efficiency of parallelism in general, and OpenMP (an industry wide standard to manage thread level parallelism) in particular, is critically dependent on Amdahl's law, e.g. on reducing the sequential part of a program so as to achieve the higher speedup expected on a platform with a large number of threads. Without reducing the sequential part (here, the time that it takes to invoke the parallel threads and have them start the useful work), there is less of an incentive to use parallelism, and thus less of an incentive to use machines such as Blue Gene/Q (BGQ) that rely on a large number of power efficient processors as building blocks for its supercomputing power.

SUMMARY

By dedicating a hardware memory structure (e.g., a small dedicated hardware memory structure) to hold the data that the master thread writes in order to indicate to its worker thread(s) where to find the work, faster latencies can be provided. In addition, the data can be preserved as long as needed without competition from regular accesses (as there would be in a typical cache).

In one embodiment, a computer system is provided, the computer system comprising: a first processor comprising hardware; a first main memory; a first L1 cache; a first L2 cache; and a dedicated memory structure for holding data indicating one or more available worker threads, the dedicated memory structure being distinct from each of the first main memory, the first L1 cache and the first L2 cache; wherein the first processor is configured to access, in the dedicated memory structure, the data for detecting by the first processor at least one available worker thread and informing by the first processor the detected at least one available worker thread of at least one task to execute.

In another embodiment, a computer readable storage medium, tangibly embodying a program of instructions executable by a computer processor for storing and accessing data is provided, the program of instructions, when executing, performing the following steps: providing access, for the computer processor, to a main memory; providing access, for the computer processor, to an L1 cache; providing access, for the computer processor, to an L2 cache; providing access, for the computer processor, to a dedicated memory structure for holding data indicating one or more available worker threads, the dedicated memory structure being distinct from each of the main memory, the L1 cache and the L2 cache; storing by the processor, in the dedicated memory structure, at least some of the data; detecting by the computer processor from the data stored in the dedicated memory structure at least one available worker thread; and informing by the computer processor the detected at least one available worker thread of at least one task to execute.

In another embodiment, a computer-implemented method for storing and accessing data is provided, the method comprising: providing access, for a first computer processor, to a first main memory; providing access, for the first computer processor, to a first L1 cache; providing access, for the first computer processor, to a first L2 cache; providing access, for the first computer processor, to a dedicated memory structure for holding data indicating one or more available worker threads, the dedicated memory structure being distinct from each of the first main memory, the first L1 cache and the first L2 cache; storing by the first computer processor, in the dedicated memory structure, at least some of the data; detecting by the first computer processor from the data stored in the dedicated memory structure at least one available worker thread; and informing by the first computer processor the detected at least one available worker thread of at least one task to execute.

BRIEF DESCRIPTION OF THE DRAWINGS

Various objects, features and advantages of the present invention will become apparent to one skilled in the art, in view of the following detailed description taken in combination with the attached drawings, in which.

DETAILED DESCRIPTION

In one example, one or more systems may provide a dedicated memory structure (that is, hardware device) holding data for detecting available worker thread(s) and informing available worker thread(s) of task(s) to execute. In another example, one or more methods may operate in the context of a dedicated memory structure (that is, hardware device) holding data for detecting available worker thread(s) and informing available worker thread(s) of task(s) to execute. In another example, one or more algorithms may operate in the context of a dedicated memory structure (that is, hardware device) holding data for detecting available worker thread(s) and informing available worker thread(s) of task(s) to execute.

In one embodiment, a custom, dedicated memory structure (that is, hardware device) is provided to hold the data (which may be in the form of a data structure including one or more records) used by one or more master threads to communicate a task description of the work to execute by one or more worker threads. In one example, records are of known size and can be efficiently managed. In another example, records have a distinct usage pattern, being written by one thread (the master) and then read by one or more threads (possibly the master thread, and one or more worker threads when work can be executed in parallel). In one example, the dedicated memory structure may also implement custom notification of worker(s), which can sleep until the record is fully completed.

For the purposes of this disclosure the term "memory structure" is intended to refer to a hardware device.

For the purposes of this disclosure the term "data structure" is intended to refer to a format or configuration of data (such as may be stored as one or more records in a memory structure).

For the purposes of this disclosure the term "main memory" is intended to refer to a hardware device (such as a RAM) which stores, among other things, program operating instructions for a computer.

Figure 1:
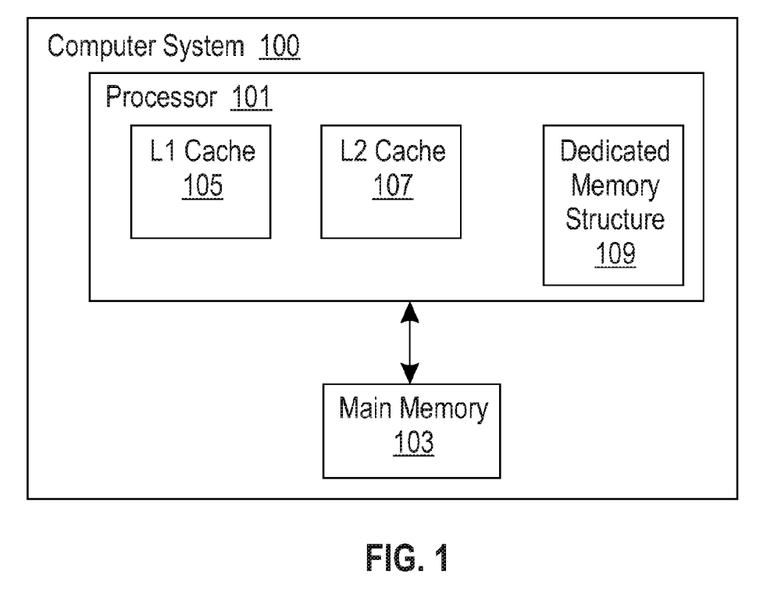
FIG. 1 depicts a block diagram of a system according to an embodiment.

Referring now to FIG. 1, depicted is a computer system 100 including a processor 101 (comprising hardware), a main memory 103, an L1 cache 105, and an L2 cache 107. In this embodiment, the L1 cache 105 and the L2 cache 107 are integrated as part of processor 101 (the L1 cache 105 and the L2 cache 107 are in operative communication with the processor 101 via a bus, not shown). Further, main memory 103 is in operative communication with processor 101 via a communication channel as shown.

Still referring to FIG. 1, the computer system also includes a dedicated memory structure 109 for holding data indicating one or more available worker threads. The dedicated memory structure 109 is distinct from each of the main memory 103, the L1 cache 105 and the L2 cache 107. The dedicated memory structure 109, in this example, is dedicated to holding only data related to indicating one or more available worker threads and associated task(s) to execute. Further, the processor 101 is configured to access, in the dedicated memory structure 109, the data for detecting at least one available worker thread and informing the detected at least one available worker thread of at least one task to execute.

Figure 2:
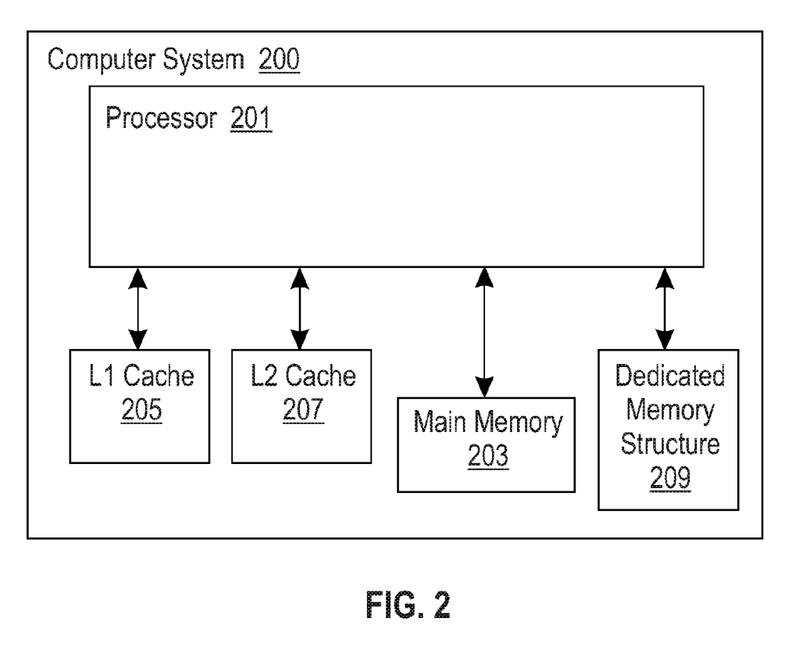
FIG. 2 depicts a block diagram of a system according to an embodiment.

Referring now to FIG. 2, depicted is a computer system 200 including a processor 201 (comprising hardware), a main memory 203, an L1 cache 205, an L2 cache 207 and a dedicated memory structure 209 for holding data indicating one or more available worker threads. The dedicated memory structure 209 is distinct from each of the main memory 203, the L1 cache 205 and the L2 cache 207. The dedicated memory structure 209 is, in this example, dedicated to holding only data related to indicating one or more available worker threads and associated task(s) to execute. Further, the processor 201 is configured to access, in the dedicated memory structure 209, the data for detecting at least one available worker thread and informing the detected at least one available worker thread of at least one task to execute.

The computer system 200 of this FIG. 2 differs from the computer system 100 of FIG. 1 in that in this FIG. 2, each of the L1 cache 205, the L2 cache 207 and the dedicated memory structure 209 are not integrated as part of processor 201 (each of the L1 cache 205, the L2 cache 207 and the dedicated memory structure 209 are in operative communication with the processor 201 via respective communication channels, as shown).

Figure 3:
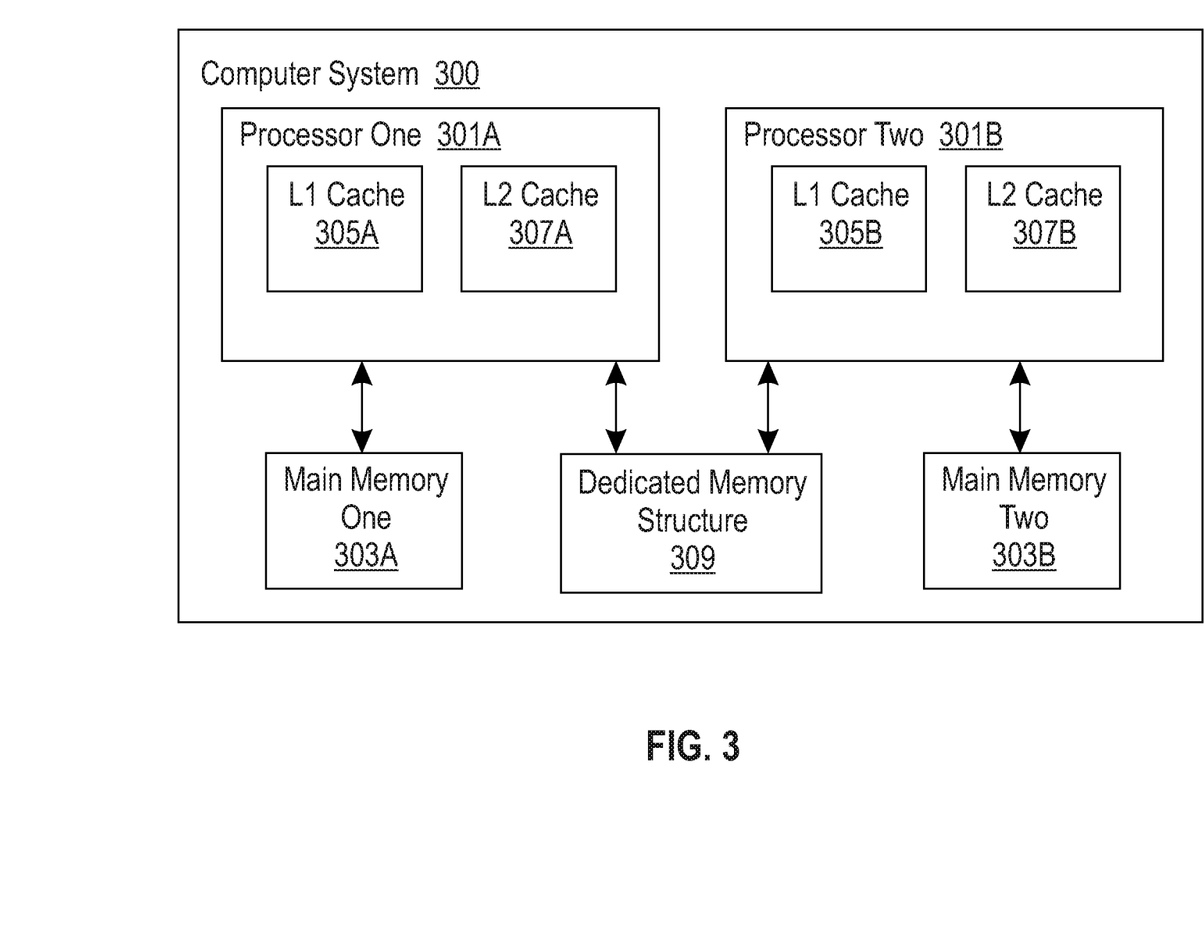
FIG. 3 depicts a block diagram of a system according to an embodiment.

Referring now to FIG. 3, depicted is a multi-processor computer system 300 including a processor 301A (comprising hardware), a main memory 303A, an L1 cache 305A, an L2 cache 307A, a processor 301B (comprising hardware), a main memory 303B, an L1 cache 305B, an L2 cache 307B and a dedicated memory structure 309 for holding data indicating one or more available worker threads. The dedicated memory structure 309 is distinct from each of the main memory 303A, the L1 cache 305A, the L2 cache 307A, the main memory 303B, the L1 cache 305B, and the L2 cache 307B. The dedicated memory structure 309 is, in this example, dedicated to holding only data related to indicating one or more available worker threads and associated task(s) to execute. Further, the processor 301A is configured to access, in the dedicated memory structure 309, the data for detecting at least one available worker thread and informing the detected at least one available worker thread of at least one task to execute. Further still, the processor 301B is configured to access, in the dedicated memory structure 309, the data for detecting at least one available worker thread and informing the detected at least one available worker thread of at least one task to execute. FIGS. 1, 2, and 3 show various embodiments of computer systems including examples of the novel dedicated memory structure. Those of ordinary skill in the art of computer systems would understand that this innovation also applies to other computer systems with more levels of caches than depicted in FIGS. 2 and 3, for example, including level 3 (L3) caches, or even levels 3 and 4 caches. Also, the current innovation equally applys to computer systems where combinations of cache levels may be included in the processors while the other cache levels would be excluded from the processors.

In this embodiment, the L1 cache 305A and the L2 cache 307A are integrated as part of processor 301A (the L1 cache 305A and the L2 cache 307A are in operative communication with the processor 301A via a bus, not shown). Further, main memory 303A is in operative communication with processor 301A via a communication channel as shown. Further, in this embodiment, the L1 cache 305B and the L2 cache 307B are integrated as part of processor 301B (the L1 cache 305B and the L2 cache 307B are in operative communication with the processor 301B via a bus, not shown). Further, main memory 303B is in operative communication with processor 301B via a communication channel as shown. Moreover, dedicated memory structure 309 is in operative communication with the processor 301A and 301B via respective communication channels, as shown. In another example, main memory 303A and main memory 303B may comprise a single main memory, not shown (such a single main memory may be in operative communication with each of processor 301A and 301B via appropriate communication channels).

Figure 4A:
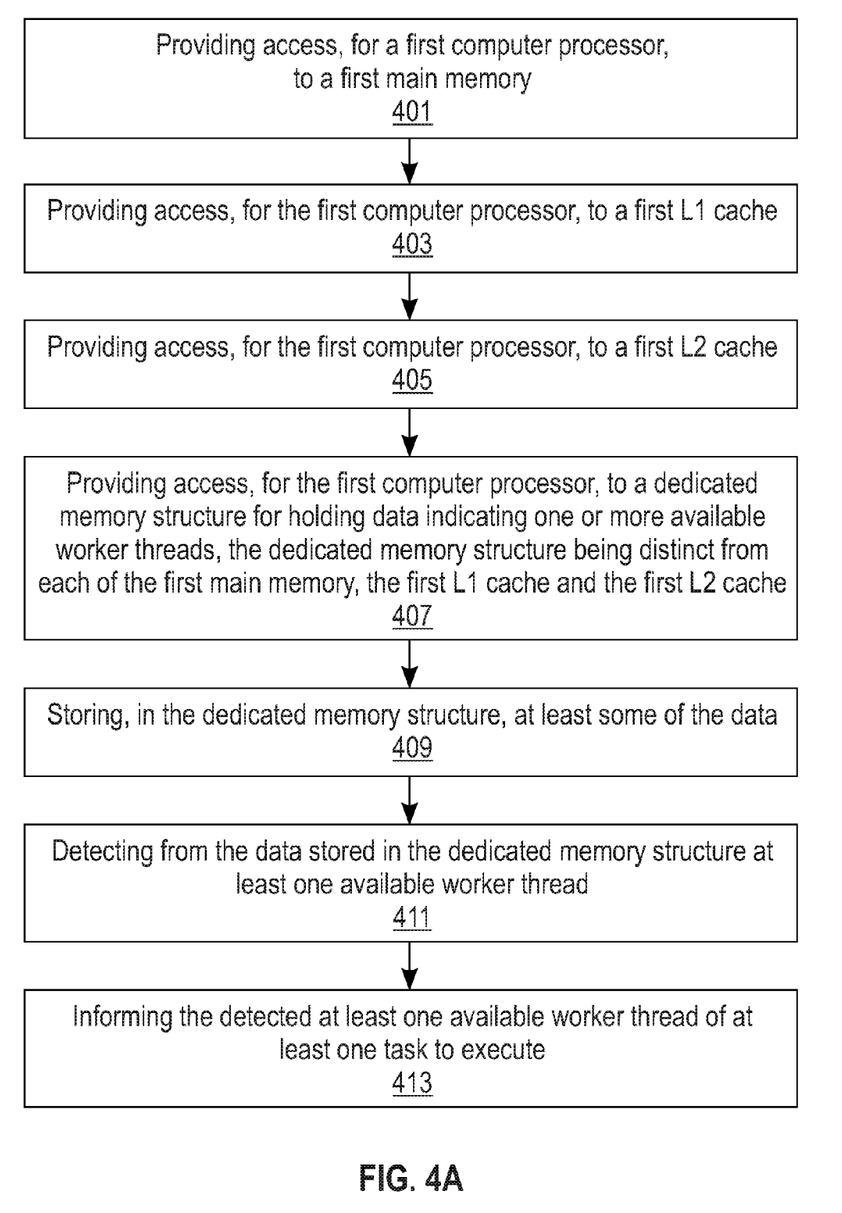
FIG. 4A depicts a block diagram of a method according to an embodiment.

Referring now to FIG. 4A, a block diagram of a method according to an embodiment is shown. As seen, this method comprises: at 401—providing access, for a first computer processor, to a first main memory; at 403—providing access, for the first computer processor, to a first L1 cache; at 405—providing access, for the first computer processor, to a first L2 cache; at 407—providing access, for the first computer processor, to a dedicated memory structure for holding data indicating one or more available worker threads, the dedicated memory structure being distinct from each of the first main memory, the first L1 cache and the first L2 cache; at 409—storing, in the dedicated memory structure, at least some of the data; at 411—detecting from the data stored in the dedicated memory structure at least one available worker thread; and at 413—informing the detected at least one available worker thread of at least one task to execute.

Figure 4B:
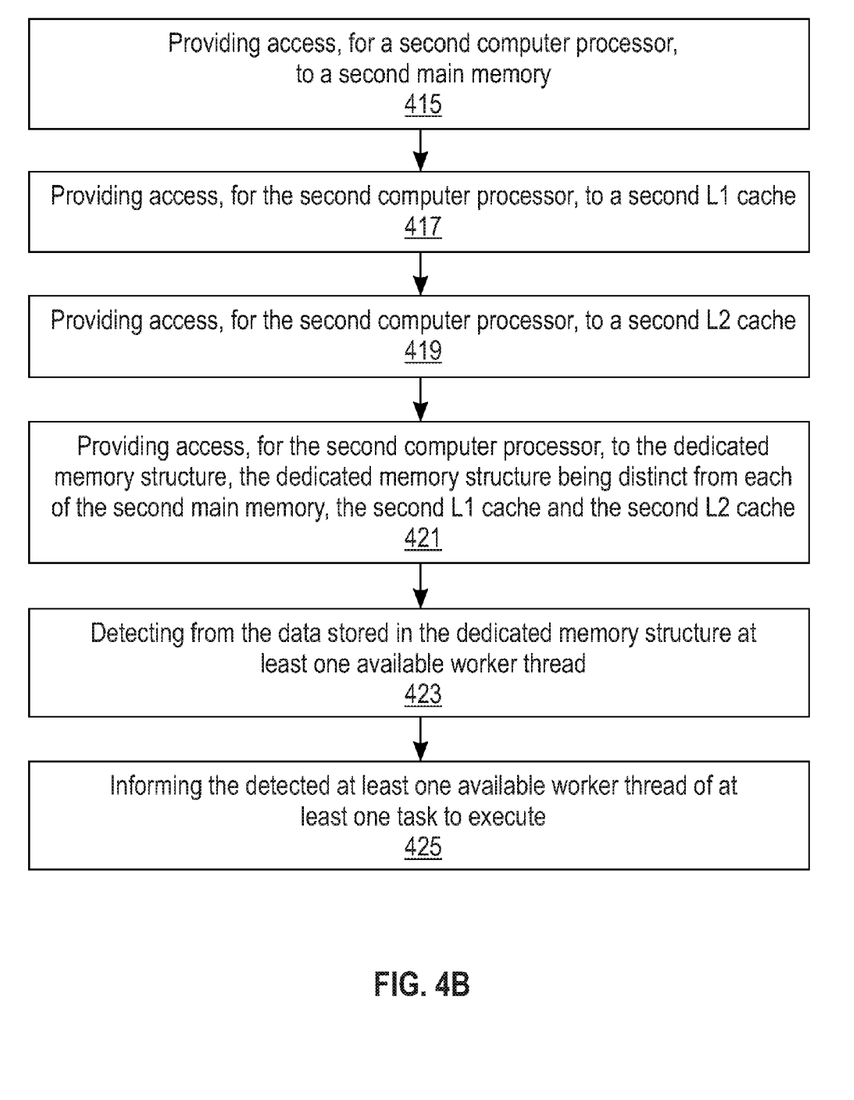
FIG. 4B depicts a block diagram of a method according to an embodiment.

Referring now to FIG. 4B, a block diagram of a method according to an embodiment is shown. As seen, this method comprises: at 415—providing access, for a second computer processor, to a second main memory; at 417—providing access, for the second computer processor, to a second L1 cache; at 419—providing access, for the second computer processor, to a second L2 cache; at 421—providing access, for the second computer processor, to the dedicated memory structure, the dedicated memory structure being distinct from each of the second main memory, the second L1 cache and the second L2 cache; at 423—detecting by the second computer processor from the data stored in the dedicated memory structure at least one available worker thread; and at 425—informing by the second computer processor the detected at least one available worker thread of at least one task to execute.

Figure 5:
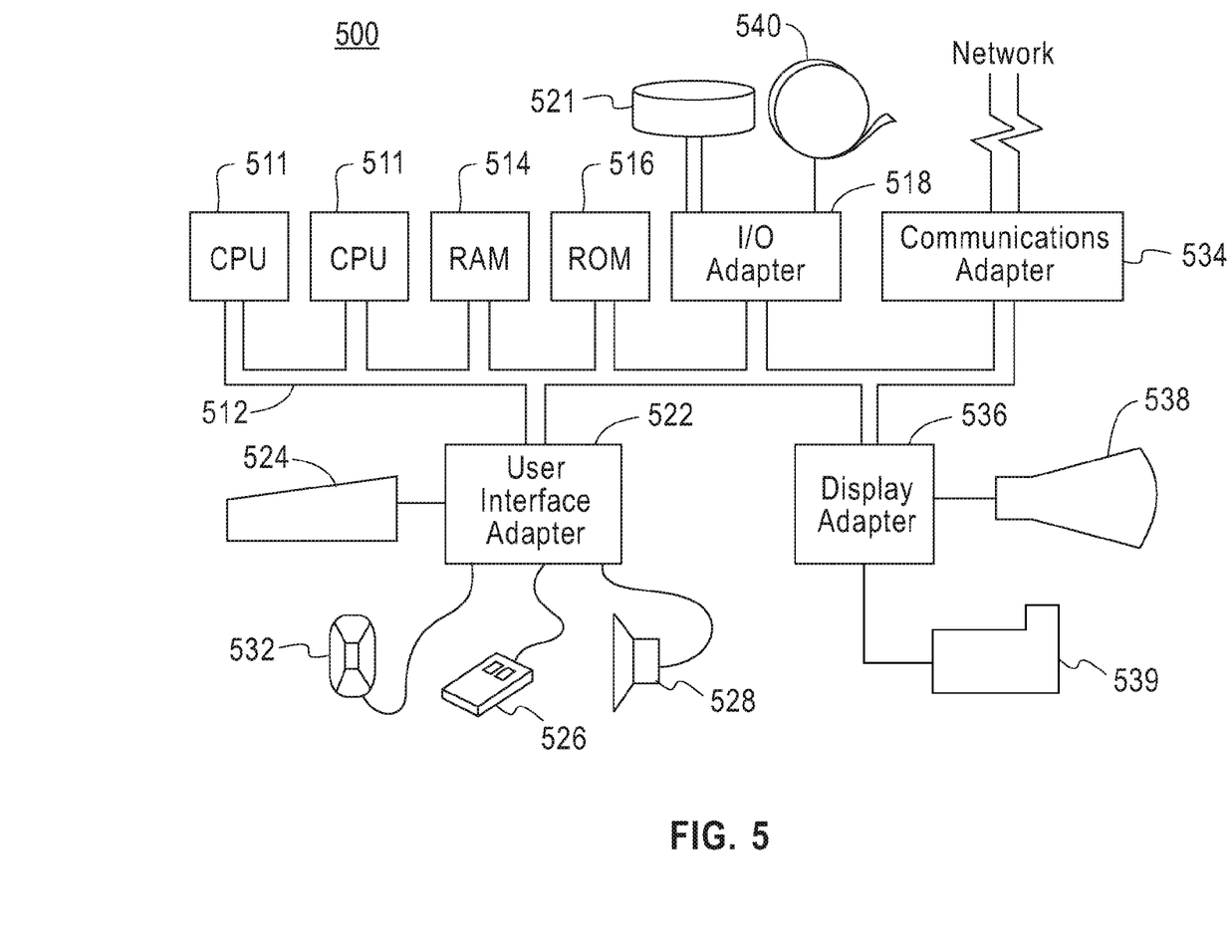
FIG. 5 depicts a block diagram of a system according to an embodiment.

Referring now to FIG. 5, this figure shows a hardware configuration of computing system 500 according to an embodiment of the present invention. As seen, this hardware configuration has at least one processor or central processing unit (CPU) 511. The CPUs 511 are interconnected via a system bus 512 to a random access memory (RAM) 514, read-only memory (ROM) 516, input/output (I/O) adapter 518 (for connecting peripheral devices such as disk units 521 and tape drives 540 to the bus 512), user interface adapter 522 (for connecting a keyboard 524, mouse 526, speaker 528, microphone 532, and/or other user interface device to the bus 512), a communications adapter 534 for connecting the system 500 to a data processing network, the Internet, an Intranet, a local area network (LAN), etc., and a display adapter 536 for connecting the bus 512 to a display device 538 and/or printer 539 (e.g., a digital printer or the like).

As described herein, when doing parallel work on a shared memory processor (such as, but not limited to, the Blue Gene/Q or BGQ), there are typically alternative phases of MPI (message passing interface) only and MPI+OpenMP (parallel threading model). When switching to OpenMP parallel, threads on the same node have to be recruited in order to perform the shared-memory parallel work. In U.S. Pat. No. 8,881,159, entitled "Constant Time Worker Thread Allocation Via Configuration Caching" (the entire disclosure of which is incorporated herein by reference), the software overheads associated with the forming parallel threads had been lowered (resulting in software acceleration). Further improvement in this regard is now limited by the fact that the key datastructures to create shared-memory parallel work use the memory subsystem also shared by all other data accesses. As a result, when creating parallel shared-memory work, the data often reside in the L2 cache or even main memory. Thus, an innovation described in the present disclosure is to create a custom, specialized fast (e.g., SRAM) memory that is dedicated to hold, for example, only these datastructures for fast creation of shared memory parallel regions. It should be noted to those of ordinary skill in the art that the dedicated memory structure's usage is not in any way limited to a parallel threading model based on the OpenMP standard, and can be used with similar benefits by other parallel threading models. A parallel threading model is to be understood as a model under which two or more threads interact with each others so as to perform a common task.

In one embodiment of the present disclosure, one or more data structures disclosed in U.S. Pat. No. 8,881,159 are mapped in the dedicated memory structure described herein.

As described herein, various embodiments may be used in the context of system architecture; memory; cache; computer hardware; computer software; computer server; aerospace industry; data analytics and modeling industry; enterprise resource planning (ERP) industry; location based services (LBS) industry; manufacturing operations industry; oil, gas or chemicals industry; information technology hardware product support services; and/or system software.

In one embodiment, a computer system is provided, the computer system comprising: a first processor comprising hardware; a first main memory; a first L1 cache; a first L2 cache; and a dedicated memory structure for holding data indicating one or more available worker threads, the dedicated memory structure being distinct from each of the first main memory, the first L1 cache and the first L2 cache; wherein the first processor is configured to access, in the dedicated memory structure, the data for detecting by the first processor at least one available worker thread and informing by the first processor the detected at least one available worker thread of at least one task to execute.

In one example, the computer system further comprises: a second processor comprising hardware; a second main memory; a second L1 cache; and a second L2 cache; wherein the dedicated memory structure is distinct from each of the second main memory, the second L1 cache and the second L2 cache; and wherein the second processor is configured to access, in the dedicated memory structure, the data for detecting by the second processor at least one available worker thread and informing by the second processor the detected at least one available worker thread of at least one task to execute.

In another example, the data stored in the dedicated memory structure is for detecting a plurality of available worker threads and informing the at least one detected available worker thread of at least one task to execute.

In another example, the data stored in the dedicated memory structure is for detecting the plurality of available worker threads and informing each of the plurality of detected available worker threads of at least one task to execute.

In another example, the data stored in the dedicated memory structure is for detecting the plurality of available worker threads and informing each of the plurality of detected available worker threads of a plurality of tasks to execute.

In another example: the first main memory comprises a first RAM; the first RAM is disposed externally to the first processor; the second main memory comprises a second RAM; and the second RAM is disposed externally to the second processor.

In another example: the first L1 cache is disposed on the first processor; the first L2 cache is disposed on the first processor; the second L1 cache is disposed on the second processor; and the second L2 cache is disposed on the second processor.

In another example, the dedicated memory structure comprises an SRAM, the SRAM is disposed externally to the first processor and the SRAM is disposed externally to the second processor.

In another embodiment, a computer readable storage medium, tangibly embodying a program of instructions executable by a computer processor for storing and accessing data is provided, the program of instructions, when executing, performing the following steps: providing access, for the computer processor, to a main memory; providing access, for the computer processor, to an L1 cache; providing access, for the computer processor, to an L2 cache; providing access, for the computer processor, to a dedicated memory structure for holding data indicating one or more available worker threads, the dedicated memory structure being distinct from each of the main memory, the L1 cache and the L2 cache; storing by the processor, in the dedicated memory structure, at least some of the data; detecting by the computer processor from the data stored in the dedicated memory structure at least one available worker thread; and informing by the computer processor the detected at least one available worker thread of at least one task to execute.

In one example, the data stored in the dedicated memory structure is for detecting a plurality of available worker threads and informing the at least one detected available worker thread of at least one task to execute.

In another example, the data stored in the dedicated memory structure is for detecting the plurality of available worker threads and informing each of the plurality of detected available worker threads of at least one task to execute.

In another example, the data stored in the dedicated memory structure is for detecting the plurality of available worker threads and informing each of the plurality of detected available worker threads of a plurality of tasks to execute.

In another example, the main memory comprises a RAM.

In another example, the RAM is disposed externally to the computer processor.

In another example, the L1 cache is disposed on the computer processor and wherein the L2 cache is disposed on the computer processor.

In another example, the dedicated memory structure comprises an SRAM.

In another example, the SRAM is disposed externally to the computer processor.

In another embodiment, a computer-implemented method for storing and accessing data is provided, the method comprising: providing access, for a first computer processor, to a first main memory; providing access, for the first computer processor, to a first L1 cache; providing access, for the first computer processor, to a first L2 cache; providing access, for the first computer processor, to a dedicated memory structure for holding data indicating one or more available worker threads, the dedicated memory structure being distinct from each of the first main memory, the first L1 cache and the first L2 cache; storing by the first computer processor, in the dedicated memory structure, at least some of the data; detecting by the first computer processor from the data stored in the dedicated memory structure at least one available worker thread; and informing by the first computer processor the detected at least one available worker thread of at least one task to execute.

In one example, the method further comprises: providing access, for a second computer processor, to a second main memory; providing access, for the second computer processor, to a second L1 cache; providing access, for the second computer processor, to a second L2 cache; providing access, for the second computer processor, to the dedicated memory structure, the dedicated memory structure being distinct from each of the second main memory, the second L1 cache and the second L2 cache; detecting by the second computer processor from the data stored in the dedicated memory structure at least one available worker thread; and informing by the second computer processor the detected at least one available worker thread of at least one task to execute.

In another example, the method further comprises storing by the second computer processor, in the dedicated memory structure, at least some of the data.

In other examples, any steps described herein may be carried out in any appropriate desired order.

In another example, all or a part of the memory structure is dedicated to holding data (e.g., in the form of a data structure) indicating which thread(s) are available for work and which thread(s) are not. Custom locking of this data structure could be implemented so as to prevent concurrent access to the data structure.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer system, the computer system comprising:
a first processor comprising hardware;
a first main memory associated with the first processor;
a first L1 cache associated with the first processor;
a first L2 cache associated with the first processor;
a second processor comprising hardware;
a second main memory associated with the second processor;
a second L1 cache associated with the second processor;
a second L2 cache associated with the second processor; and
a dedicated memory structure for holding data indicating a plurality of available worker threads, the dedicated memory structure being distinct from each of the first main memory, the first L1 cache, the first L2 cache, the second main memory, the second L1 cache and the second L2 cache;
wherein the first processor is configured to access, in the dedicated memory structure, the data, wherein the first processor is configured to detect from the data at least one first available worker thread, and wherein the first processor is configured to inform the detected at least one first available worker thread of at least one first task to execute and
wherein the second processor is configured to access, in the dedicated memory structure, the data, wherein the second processor is configured to detect from the data at least one second available worker thread, and wherein the second processor is configured to inform the detected at least one second available worker thread of at least one second task to execute.

2. The computer system of claim 1, wherein:

the data stored in the dedicated memory structure is for detecting by the first processor a first plurality of available worker threads and informing by the first processor each of the first plurality of detected available worker threads of the at least one first task to execute; and the data stored in the dedicated memory structure is for detecting by the second processor a second plurality of available worker threads and informing by the second processor each of the second plurality of detected available worker threads of the at least one second task to execute.

3. The computer system of claim 2, wherein:

the data stored in the dedicated memory structure is for detecting by the first processor the first plurality of available worker threads and informing by the first processor each of the first plurality of detected available worker threads of a first plurality of tasks to execute; and the data stored in the dedicated memory structure is for detecting by the second processor the second plurality of available worker threads and informing by the second processor each of the second plurality of detected available worker threads of a second plurality of tasks to execute.

4. The computer system of claim 1, wherein:

the first main memory comprises a first RAM;

the first RAM is disposed externally to the first processor;

the second main memory comprises a second RAM; and the second RAM is disposed externally to the second processor.

5. The computer system of claim 1, wherein:

the first L1 cache is disposed on the first processor;

the first L2 cache is disposed on the first processor;

the second L1 cache is disposed on the second processor; and the second L2 cache is disposed on the second processor.

6. The computer system of claim 1, wherein the dedicated memory structure comprises an SRAM, the SRAM is disposed externally to the first processor and the SRAM is disposed externally to the second processor.

7. A computer readable storage medium, tangibly embodying program instructions executable by a first computer processor and a second computer processor for storing and accessing data, the program instructions, when executing, performing the following steps:

providing access, for the first computer processor, to a first main memory associated with the first computer processor;

providing access, for the first computer processor, to a first L1 cache associated with the first computer processor;

providing access, for the first computer processor, to a first L2 cache associated with the first computer processor;

providing access, for the second computer processor, to a second main memory associated with the second computer processor;

providing access, for the second computer processor, to a second L1 cache associated with the second computer processor;

providing access, for the second computer processor, to a second L2 cache associated with the second computer processor;

providing access, for the first computer processor, to a dedicated memory structure for holding data indicating a plurality of available worker threads, the dedicated memory structure being distinct from each of the first main memory, the first L1 cache, the first L2 cache, the second main memory, the second L1 cache and the second the L2 cache;

providing access, for the second computer processor, to the dedicated memory structure;

storing by the first computer processor, in the dedicated memory structure, at least some of the data;

storing by the second computer processor, in the dedicated memory structure, at least some of the data;

detecting by the first computer processor from the data stored in the dedicated memory structure at least one first available worker thread;

detecting by the second computer processor from the data stored in the dedicated memory structure at least one second available worker thread;

informing by the first computer processor the detected at least one first available worker thread of at least one first task to execute; and informing by the second computer processor the detected at least one second available worker thread of at least one second task to execute.

8. The storage medium of claim 7, wherein:

the data stored in the dedicated memory structure is for detecting by the first processor a first plurality of available worker threads and informing by the first processor each of the first plurality of detected available worker threads of the at least one first task to execute; and the data stored in the dedicated memory structure is for detecting by the second processor a second plurality of available worker threads and informing by the second processor each of the second plurality of detected available worker threads of the at least one second task to execute.

9. The storage medium of claim 6, wherein:

the data stored in the dedicated memory structure is for detecting by the first processor the first plurality of available worker threads and informing by the first processor each of the first plurality of detected available worker threads of a first plurality of tasks to execute; and the data stored in the dedicated memory structure is for detecting by the second processor the second plurality of available worker threads and informing by the second processor each of the second plurality of detected available worker threads of a second plurality of tasks to execute.

10. The storage medium of claim 7, wherein the first main memory comprises a first RAM and the second main memory comprises a second RAM.

11. The storage medium of claim 10, wherein the first RAM is disposed externally to the first computer processor and the second RAM is disposed externally to the second computer processor.

12. The storage medium of claim 7, wherein the first L1 cache is disposed on the first computer processor, wherein the first L2 cache is disposed on the first computer processor, wherein the second L1 cache is disposed on the second computer processor, and wherein the second L2 cache is disposed on the second computer processor.

13. The storage medium of claim 7, wherein the dedicated memory structure comprises an SRAM.

14. A computer-implemented method for storing and accessing data, the method comprising:

providing access, for a first computer processor, to a first main memory associated with the first computer processor;

providing access, for the first computer processor, to a first L1 cache associated with the first computer processor;

providing access, for the first computer processor, to a first L2 cache associated with the first computer processor;

providing access, for a second computer processor, to a second main memory associated with the second computer processor;

providing access, for the second computer processor, to a second L1 cache associated with the second computer processor;

providing access, for the second computer processor, to a second L2 cache associated with the second computer processor, providing access, for the first computer processor, to a dedicated memory structure for holding data indicating a plurality of available worker threads, the dedicated memory structure being distinct from each of the first main memory, the first L1 cache, the first L2 cache, the second main memory, the second L1 cache and the second the L2 cache;

providing access, for the second computer processor, to the dedicated memory structure;

storing by the first computer processor, in the dedicated memory structure, at least some of the data;

storing by the second computer processor, in the dedicated memory structure, at least some of the data;

detecting by the first computer processor from the data stored in the dedicated memory structure at least one first available worker thread;

detecting by the second computer processor from the data stored in the dedicated memory structure at least one second available worker thread;

informing by the first computer processor the detected at least one first available worker thread of at least one first task to execute; and informing by the second computer processor the detected at least one second available worker thread of at least one second task to execute.

\* \* \* \* \*